United States Patent
Butcher

(10) Patent No.: US 8,330,497 B1
(45) Date of Patent: Dec. 11, 2012

(54) FREQUENCY MONITORING SYSTEMS AND METHODS

(75) Inventor: James S. Butcher, Desert Hills, AZ (US)

(73) Assignee: ADTRAN, Inc., Huntsville, AL (US)

( * ) Notice: Subject to any disclaimer, the term of this patent is extended or adjusted under 35 U.S.C. 154(b) by 100 days.

(21) Appl. No.: 12/897,444

(22) Filed: Oct. 4, 2010

(51) Int. Cl.
*H03K 9/06* (2006.01)
*G01R 23/02* (2006.01)

(52) U.S. Cl. .......................................... 327/46; 327/40
(58) Field of Classification Search ............... 327/40, 327/47
See application file for complete search history.

(56) References Cited

U.S. PATENT DOCUMENTS

| | | |
|---|---|---|
| 4,468,614 A | 8/1984 | Takahashi et al. |
| 4,680,540 A | 7/1987 | Niki et al. |
| 2008/0013668 A1 | 1/2008 | Willis |

*Primary Examiner* — Ryan Jager
(74) *Attorney, Agent, or Firm* — Maynard, Cooper & Gale, P.C.; Jon E. Holland

(57) ABSTRACT

A frequency monitoring system comprises a plurality of circuit cards. Each circuit card, such as a primary multiplexer card and a backup or redundant multiplexer card, has an oscillator that provides a reference clock signal. On each circuit card, a respective frequency compare element is configured to receive a clock signal to be measured and to provide a frequency error signal indicating a frequency error of the clock signal relative to an average frequency of a plurality of reference clock signals. Accordingly, the frequency measurements for the circuit cards are based on the same reference frequency (e.g., the average frequency of the reference clock signals from the oscillators).

15 Claims, 5 Drawing Sheets

FREQUENCY MONITORING SYSTEMS AND METHODS

RELATED ART

High reliability carrier data communication equipment typically uses redundant components, such as, for example, redundant data multiplexer circuit cards, in order to enhance system reliability. One or more frequency monitors can be designed into a circuit card in order to provide a built-in frequency measurement capability for timing sources, such as a clock signal recovered from a received data stream. It is desirable to monitor frequencies on both a primary card and a redundant card so they can be compared accurately.

In this regard, each card typically employs a separate oscillator, such as a temperature-compensated crystal oscillator (TCXO) or an oven-controlled crystal oscillator (OCXO), to provide a reference clock signal for measuring the frequency of the card's timing source. Unfortunately, there is usually a slight frequency offset in the reference clock signals for the two cards resulting in different frequency measurements reported from each card even for identical timing source frequencies. Thus, if frequency monitoring of a clock signal is switched from one card to the other, a customer may undesirably observe a fluctuation in frequency measurements due to the offset between the reference clock signals even if there is no change to the clock signal being monitored.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Embodiments of the present disclosure generally pertain to frequency monitoring systems and methods. The term "frequency offset" generally refers to an amount that the actual frequency of a signal deviates from a nominal or ideal frequency. A frequency offset is often calculated to represent a difference between a signal's actual frequency and its nominal frequency, divided by the nominal frequency. In such form, the frequency offset is dimensionless and often expressed in parts per million (ppm) to avoid inconvenient small fractional numbers.

A system in accordance with an exemplary embodiment of the present disclosure comprises a plurality of circuit cards. Each circuit card, such as a primary multiplexer card and a backup or redundant multiplexer card, has an oscillator that provides a reference clock signal. On each circuit card, a respective frequency compare element is configured to receive a clock signal to be measured and to provide a frequency error signal indicating a frequency error of the clock signal relative to an average frequency of a plurality of reference clock signals. Accordingly, the frequency measurements for the circuit cards are based on the same reference frequency (e.g., the average frequency of the reference clock signals from the oscillators). In addition, if one card fails or is removed, the change in the reference frequency is less relative to an embodiment in which frequency measurements are switched from the failed card to a working card when, prior to the switch, frequency measurements on the failed card are independent of the reference clock on the working card.

Figure 1:
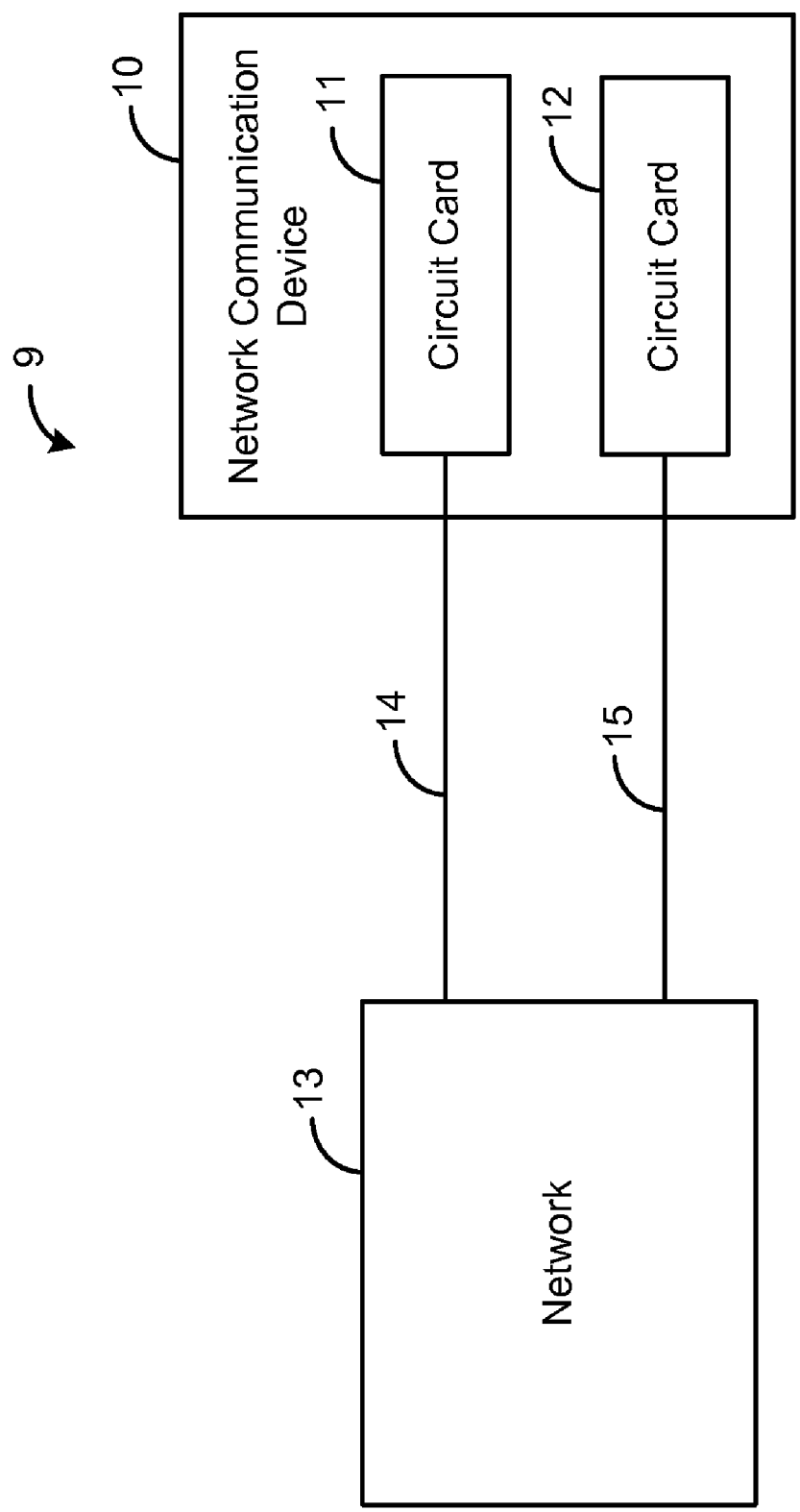
FIG. 1 is a block diagram depicting an exemplary embodiment of a communication system.

FIG. 1 depicts a communication system 9 comprising a network communication device 10 that is configured to communicate with a network 13. In this regard, the network communication device 10 is coupled to the network 13 via subscriber lines 14 and 15. In one exemplary embodiment, each subscriber line 14 and 15 is a twisted-wire pair, but other types of connections, such as optical fibers, may be used in other embodiments. In the exemplary embodiment shown by FIG. 1, each subscriber line 14 and 15 is coupled to and terminated by a respective circuit card 11 and 12, and one circuit card is redundant to the other for backup purposes. In particular, each card 11 and 12 is similarly configured. If a problem occurs on or with the communication handled by one card, then the communication is switched to the other card. As an example, if a performance parameter, such as a signal-to-noise ratio, for communication occurring on subscriber line 14 falls below or otherwise passes a specified threshold, such communication may be switched to the subscriber line 15. For illustrative purposes, FIG. 1 shows two circuit cards 11 and 12, but other numbers of circuit cards 11 and 12 are possible in other embodiments. The network communication device 10 may be located at a customer premises (not shown) or at other locations in the communication system 9, such as an intermediate point between a customer premises and a central office.

In one exemplary embodiment, each circuit card 11 and 12 is a multiplexer card that is configured to receive a data stream from the network 13 via its respective subscriber line 14 and 15 and to demultiplex the data stream into multiple data streams. The timing of a data stream traveling across a subscriber line 14 or 15 is controlled by a respective clock signal, discussed in more detail hereafter, which may be recovered and used by a circuit card 11 or 12 to process the data stream. The clock signals for the data streams on the subscriber lines 14 and 15 are typically at the same frequency based on a common network clock source. The circuit cards 11 and 12 further communicate with one another such that both cards 11 and 12 use the same reference frequency, as will be discussed in more detail hereafter. Thus, if frequency measurements for the same clock signal are switched from one card to the other, there should not be a noticeable change to the frequency measurements due to the switch assuming that the reference clock signals remain available.

Figure 2:
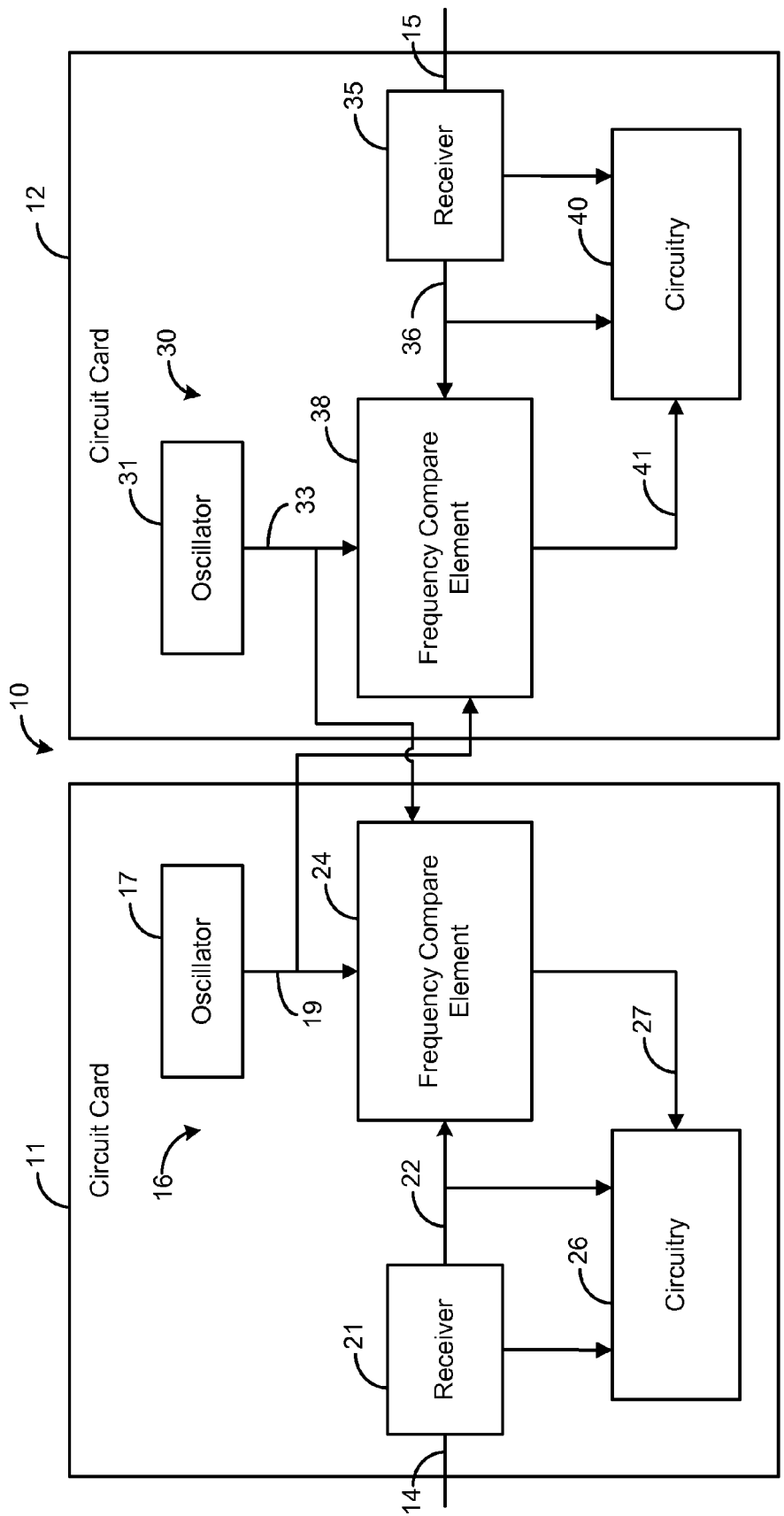
FIG. 2 is a block diagram depicting an exemplary embodiment of a network communication device, such as is depicted by FIG. 1.

FIG. 2 depicts an exemplary embodiment of a network communication device 10, such as is shown by FIG. 1. The network communication device 10 comprises a plurality of circuit cards 11 and 12. Each circuit card 11 and 12 has a frequency monitoring system 16 and 30 comprising an oscillator 17 and 31 and a frequency compare element 24 and 38, respectively. Each oscillator 17 and 31 is configured to provide a reference clock signal 19 and 33, respectively, to both cards 11 and 12, as shown. In one exemplary embodiment, each oscillator 17 and 31 is temperature compensated such that it provides a stable clock signal across a wide range of temperature, but other types of oscillators are possible in other embodiments. Notably, there can be a slight frequency difference in the reference clock signals 19 and 33. In this regard, it is unnecessary for the oscillators 17 and 31 to be synchronized with each other, and one oscillator may drift with respect to the other oscillator.

The exemplary circuit card 11 comprises the oscillator 17, a receiver 21, the frequency compare element 24, and circuitry 26. The receiver 21 is configured to receive a data stream communicated across the subscriber line 14, to recover a clock signal 22 from the data stream, and to transmit the clock signal 22 to the frequency compare element 24. The frequency compare element 24 is configured to receive the reference clock signals 19 and 33 from the oscillators 17 and 31, respectively, and compare a frequency of the clock signal 22 to an average frequency of the reference dock signals 19 and 33. In this regard, the frequency compare element 24 transmits a frequency error signal 27 indicating a frequency error of the clock signal 22 relative to an average frequency of the clock signals 19 and 33. In one embodiment, the frequency error signal 27 indicates the difference between the frequency offset of the clock signal 22 and an average frequency offset of the reference clock signals 19 and 33 over a sample period. There are various techniques that can be used to achieve the foregoing.

In one exemplary embodiment, the frequency compare element 24 calculates an average reference frequency offset indicating an average frequency difference between the reference clock signals 19 and 33 over a sample period, discussed in more detail hereafter. The frequency compare element 24 is further configured to receive the clock signal 22 from the receiver 21 and calculate a frequency offset indicating the offset in frequency between the clock signal 22 and the reference clock signal 19 over the sample period. Furthermore, the frequency compare element 24 is configured to provide the frequency error signal 27, which indicates the difference between the frequency offset and the average reference frequency offset over the sample period. The circuitry 26 receives the frequency error signal 27 from the frequency compare element 24 and processes the signal 27 as may be desired.

Similarly, the exemplary circuit card 12 comprises the oscillator 31, a receiver 35, the frequency compare element 38, and circuitry 40. The oscillator 31 is configured to provide a reference clock signal 33. The receiver 35 is configured to receive a data stream communicated by the subscriber line 15, to recover a clock signal 36 from the data stream, and to transmit the clock signal 36 to the frequency compare element 38. The frequency compare element 38 is configured to receive the reference clock signals 19 and 33 from the oscillators 17 and 31 and compare the frequency of the clock signal 36 to an average frequency of the reference clocks signals 19 and 33, according to similar techniques described above for the circuit card 11. Note that, if desired, the average frequency of the reference clock signals 19 and 33 may be weighted differently such that the influence of each reference clock signal 19 and 33 to the average is not equal. However, different weighting of the reference clock signals 19 and 33 is unnecessary. For illustrative purposes, it will be assumed hereafter that the reference clock signals 19 and 33 are weighted equally in determining or comparing their average frequency.

In one exemplary embodiment, the frequency compare element 38 calculates an average reference frequency offset indicating an average frequency difference between the reference clock signals 19 and 33 over a sample period, discussed in more detail hereafter. The frequency compare element 38 is further configured to receive the clock signal 36 from the receiver 35 and calculate a frequency offset indicating the offset in frequency between the clock signal 36 and reference clock signal 33 over the sample period. The frequency compare element 38 is further configured to provide the frequency error signal 41, which indicates the difference between the frequency offset and the average reference frequency offset over the sample period. The circuitry 40 receives the frequency error signal 41 from the frequency compare element 38 and processes the signal 41 as may be desired.

Note that the frequency compare elements 24 and 38 may be implemented in hardware, software, firmware, or any combination thereof. In one exemplary embodiment, the frequency compare elements 24 and 38 are implemented in hardware and located on their respective circuit cards 11 and 12.

As shown by FIG. 2, the circuit card 12 is similar to the circuit card 11 such that a frequency of the clock signal 36 is measured relative to an average frequency of the reference clock signals 19 and 33, just as a frequency of the clock signal 22 is measured relative to an average frequency of the reference clock signals 19 and 33. Since measurements on both cards 11 and 12 are based on the same reference, the frequencies of clock signals 22 and 36 can be compared accurately. Such would not be the case if the frequency measurements of the card 11 were based solely on the reference clock signal 19 as a reference and if the frequency measurements of the card 12 were based solely on the reference clock signal 33 as a reference.

Further, if the circuit card 11 fails, is unplugged, or goes offline for any reason, frequency measurement can be switched to the card 12. In such case, the frequency measurement of clock signal 36 on circuit card 12 will change slightly since the frequency reference on card 12 changes from the average frequency of reference clock signals 19 and 33 to just the frequency of the clock signal 33.

Figure 3:
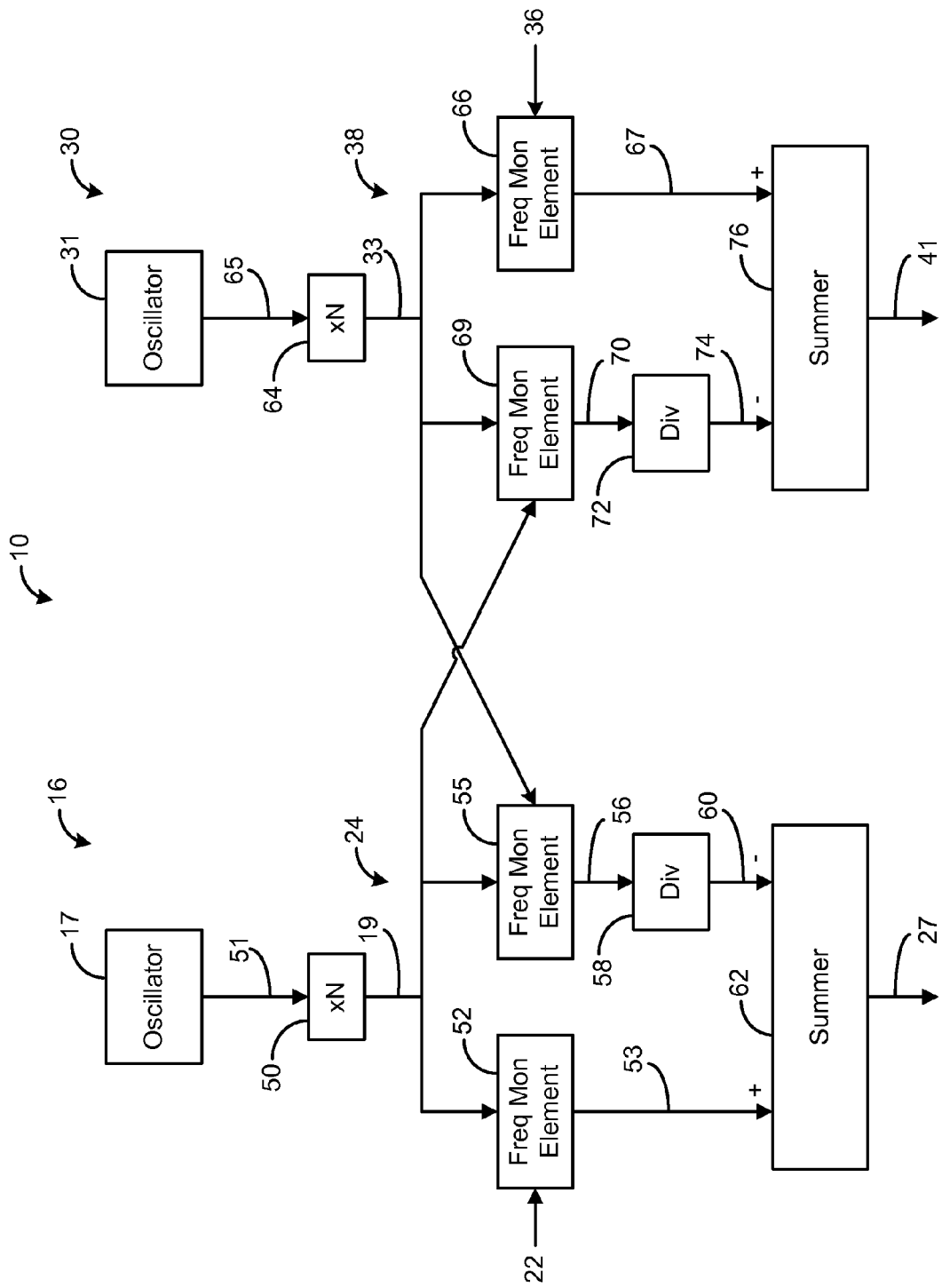
FIG. 3 is a block diagram depicting another exemplary embodiment of a network communication device, such as is depicted by FIG. 2.

FIG. 3 depicts an exemplary embodiment of the network communication device 10 of FIG. 2. The network communication device 10 comprises the oscillators 17 and 31 respectively coupled to the frequency compare elements 24 and 38. In one embodiment, the oscillators 17 and 31 are coupled to multipliers 50 and 64, respectively. Each multiplier 50 and 64 is configured to receive its respective oscillator's original clock signal 51 and 65 and scale its frequency to a reference frequency that allows an accurate frequency measurement of the clock signals 22 and 36 in a reasonable or desired sample time.

The frequency compare element 24 comprises a plurality of frequency monitoring elements 52 and 55, a divider 58, and a summer 62. In the embodiment depicted by FIG. 3, the frequency compare element 24 comprises two frequency monitoring elements 52 and 55. The frequency monitoring element 52 is configured to compare the clock signal 22 to the reference clock signal 19 and provide a frequency error signal 53 that is relative to the time domain defined by the reference clock signal 19. In one embodiment, the frequency error signal 53 comprises a digital value representing the frequency offset difference between the clock signal 22 and the reference clock signal 19 in parts per million (ppm) over a sample period.

As a mere example, assume that the desired frequency of the clock signal 22 is such that there should be ten thousand (10,000) periods of the clock signal 22 for every one million (1,000,000) periods of the reference clock signal 19. The frequency monitoring element 52 is configured to count the periods of the clock signal 22 and the periods of the reference clock signal 19 over a sample period. The length of the sample period may be selected such that, at the end of the sample period, the frequency monitoring element 52 should have ideally counted ten thousand (10,000) periods of the clock signal 22 and one million (1,000,000) periods of the reference clock signal 19 assuming no frequency error. Such sample period may be measured based on the count of the clock signal 22. For example, the sample period may be deemed to end when the count of the periods of the clock signal 22 reaches ten thousand (10,000). In other embodiments, other sample period durations and techniques for measuring the sample period may be used. As an example, the sample period duration may be based on the reference clock signal 19, if desired.

For illustrative purposes, due to frequency error in the clock signal 22 or otherwise, assume that the frequency monitoring element 52 actually counts one million two (1,000, 002) periods of the reference clock signal 19 during the sample period in which ten thousand (10,000) periods of the clock signal 22 are counted. In such case, the frequency error of the clock signal is −2 ppm (i.e., the desired count (1,000, 000) minus the actual count (1,000,002)) in the time domain of the reference clock signal 19. In such case, the output of the frequency monitoring element 52 is a digital value representing the number −2 (negative two). If, on the other hand, frequency monitoring element 52 actually counts 999,999 periods of the reference clock signal 19 during the sample period, then the frequency error of the clock signal is +1 ppm in the time domain of the reference clock signal 19. In such case, the output of the frequency monitoring element 52 is a digital value representing the number +1 (positive one). If the frequency monitoring element 52 actually counts one million (1,000,000) periods of the reference clock signal 19 during the sample period, then there is no frequency error measured in the time domain of the reference clock signal, and the frequency error signal defines a value of zero (0). Thus, the frequency monitoring element 52 provides a frequency error signal 53 indicative of the frequency error, if any, of the clock signal 22 measured in the time domain of the reference clock signal 19.

The frequency monitoring element 55 is configured to compare the local reference clock signal 19 to the reference clock signal 33 from the other circuit card 12 (FIG. 2) and provide a reference frequency offset signal 56. In one embodiment, the reference frequency offset signal 56 comprises a digital value representing the frequency offset difference between the reference clock signal 19 and the reference clock signal 33 in ppm over a same sample period. That is, using techniques similar to those described above for the frequency monitoring element 52, the frequency monitoring element 55 essentially calculates the frequency error of the reference clock signal 33 in the time domain of the reference clock signal 19.

As an example, assume that the reference clock signals 19 and 33 ideally are at the same frequency such that there should be one million (1,000,000) periods for both reference clock signals 19 and 33 during a sample period, which may be measured based on the reference clock signal 19. If the frequency monitoring element actually counts one million three (1,000,003) periods of the reference clock signal 33 during the sample period in which one million (1,000,000) periods of the reference clock signal 19 are counted, then the reference frequency offset signal 56 indicates an error of +3 ppm for the reference clock signal 19 in the time domain of the reference clock signal 33.

As shown by FIG. 3, the reference frequency offset signal 56 is transmitted to a divider 58, in order to determine an average frequency offset signal 60 indicating the average difference between the frequencies of the reference clock signals 19 and 33 over the sample period. To convert the value of the reference frequency offset signal 56 to an average, the divider 58 divides the value of the reference frequency offset signal 56 by two in order to determine the average frequency offset signal 60.

Accordingly, if the value of the reference frequency offset signal 56 is −3 ppm, as described above, then the average frequency offset signal 60 has a value of −1.5 ppm. In other embodiments, other numbers of reference clock signals may be used. The average frequency offset signal 60 indicates the frequency error of the reference clock signal 33 relative to a time domain defined by the average frequency of the reference clock signals 19 and 33.

The frequency error signal 53 and the average frequency offset signal 60 are then transmitted to a summer 62, which is configured to subtract the value of the average frequency offset signal 60 from the value of the frequency error signal 53 to provide a frequency error signal 27. In one embodiment, the frequency error signal 27 is a digital value indicating the difference between the value of the frequency error signal 53 and the value of the average frequency offset signal 60 in ppm over the sample period. The frequency error signal 53 indicates the error of the clock signal 22 relative to an average frequency of the reference clock signals 19 and 33. Upon conclusion of the sample period, the frequency monitoring elements 52 and 55 are reset in order to determine the frequency error of the clock signal 22 relative to an average frequency of the reference clock signals 19 and 33, as described above, for a new sample period. The frequency error signal 27 is then sent to the circuitry 26 (FIG. 2) for processing.

Note that the adjustment performed by the summer 27 essentially adjusts the frequency error indicated by the frequency error signal 53 (which is relative to the frequency of the clock signal 19) to be relative to an average frequency of the reference clock signals 19 and 33. Thus, the value of the frequency error signal 27 indicates the amount that the frequency of the clock signal 22 deviates from its nominal frequency in ppm during the sample period assuming that the average frequency of the reference clock signals 19 and 33 is error free or, in other words, in the time domain defined by a reference clock signal (not shown) having a frequency equal to the average frequency of the reference clock signals 19 and 33.

Also note that frequency monitoring element 55 could calculate the frequency error of the reference clock signal 19 in the time domain of the reference clock signal 33, if desired. In such case, the values of the signals 56 and 60 are the same as those described above for the embodiment in which the frequency monitoring element 55 determines the frequency error of the reference clock signal 33 in the time domain of the reference clock signal 19, except that the signs of the values are reversed. If the frequency error of the reference clock signal 19 is calculated in the time domain of the reference clock signal 33, the summer 62 is configured to add the values of the signals 53 and 60 rather than subtracting them. In either embodiment, the value of the frequency error signal 27 is the same.

Figure 5:
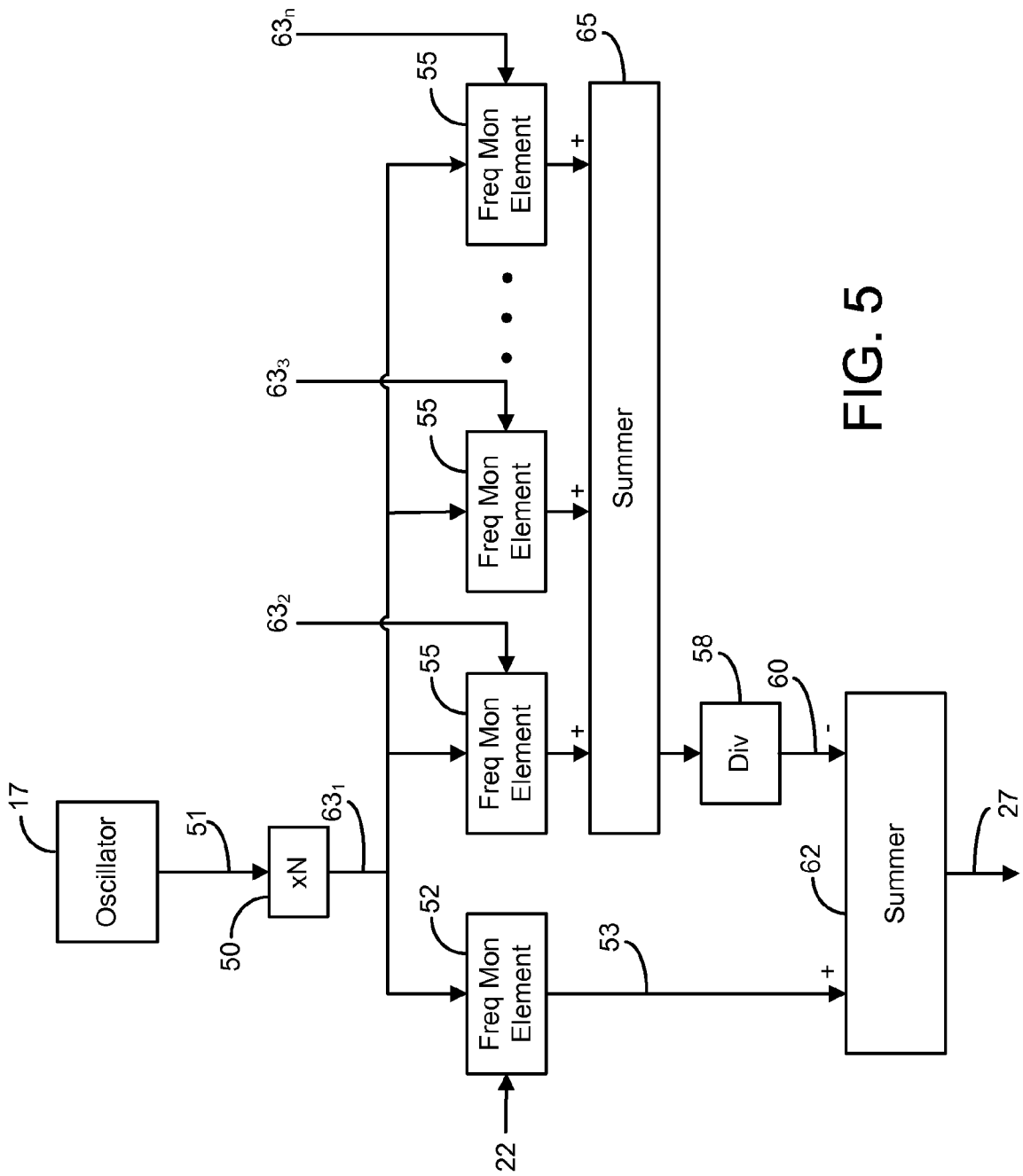
FIG. 5 is a block diagram depicting yet another exemplary embodiment of a network communication device.

In addition, in other embodiments, other numbers of reference clock signals may be used. As an example, FIG. 5 depicts an exemplary embodiment similar to the one shown by FIG. 3 except that the reference frequency is based on n number of reference clock signals $63_1$-$63_n$. The frequency offset signals output by the frequency monitoring elements 55 are summed by a summer 65 to provide a sum, which is divided by n.

Similar to the frequency compare element 24, the frequency compare element 38 comprises a plurality of frequency monitoring elements 66 and 69, a divider 72, and a summer 76. These monitoring elements function the same as elements 52, 55, 58, and 62 respectively previously described and provide a frequency error signal 41 to the circuitry 40 (FIG. 2) for processing.

Note that the frequency error signal 27 will be equal to the frequency error signal 41 if the frequency of clock signal 22 is equal to the frequency of the clock signal 36, even though the reference clock signals 19 and 33 produced by the oscillators 17 and 31, respectively, are different. In this regard, the clocking reference, which is a frequency average of the clock signals 19 and 33, is the same for both cards 11 and 12. Furthermore, if one circuit card, for example, the circuit card 11, fails or is removed from the device 10, there will be a slight difference between the circuit card 12 frequency error signal 41 prior to and after the failure or removal of the card 11 since the clocking reference changes. However, such change in the frequency error signal 41 is one-half of the change that would have occurred in an implementation where each frequency error signal 27 and 41 was based on a single reference clock signal rather than an average of the reference clock signals 19 and 33 prior to the switch.

In one exemplary embodiment, assume that the network communication device 10 comprises two circuit cards 11 and 12 with the card 11 serving as the primary card and the card 12 serving as the backup card. Also assume that the card 11 comprises two frequency monitoring elements 52 and 55 and the card 12 also comprises two frequency monitoring elements 66 and 69. Further assume that the frequency monitoring element 52 receives a clock signal 22 and the frequency monitoring element 66 receives a clock signal 36. Also assume that the clock signals 22 and 36 have equal frequencies and that the oscillators 17 and 31 provide the reference clock signals 19 and 33, respectively. Assume further that the frequency offset of the reference clock signal 19 differs from the clock signals 22 and 36 by +1 part per million (ppm), and the reference clock signal 33 differs from the clock signals 22 and 36 by +2 ppm.

Figure 4:
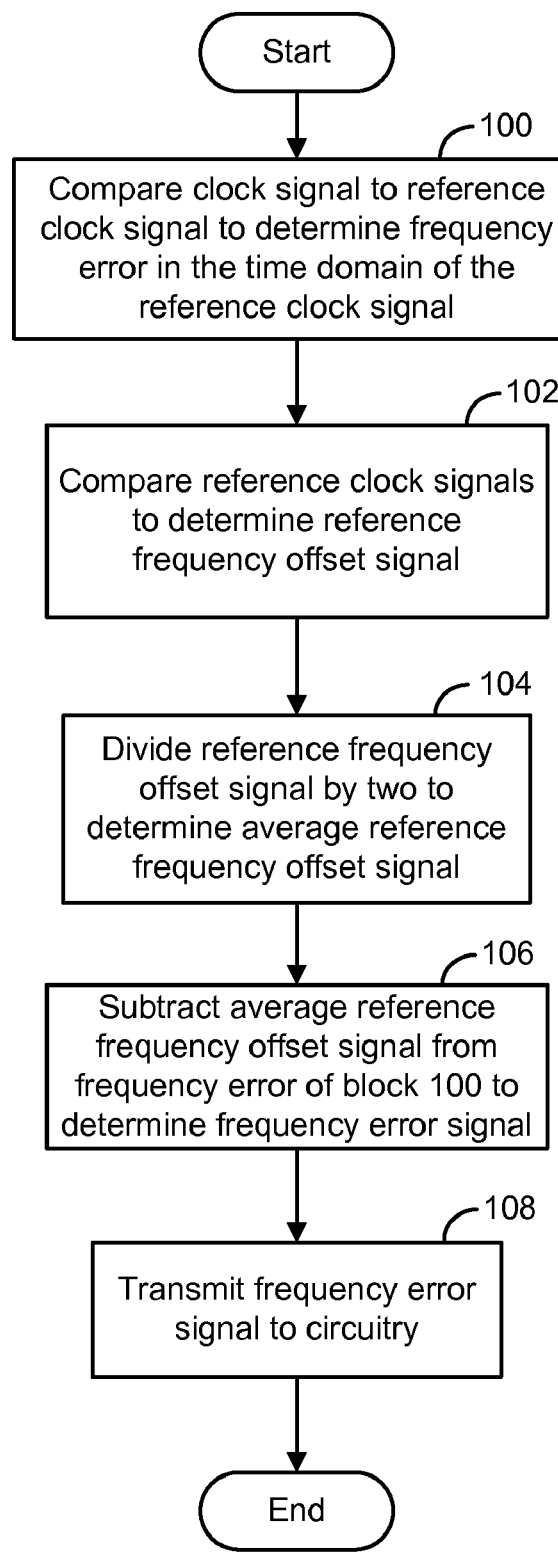
FIG. 4 is a flowchart illustrating an exemplary method of monitoring frequencies in circuit cards.

The frequency monitoring element 52 receives the clock signal 22 and the reference clock signal 19 and effectively subtracts the frequency offset of the reference clock signal 19 from the frequency offset of the clock signal 22 to determine the frequency error signal 53, which is −1 ppm, as shown by block 100 of FIG. 4. The frequency monitoring element 55 receives the reference clock signals 19 and 33 and effectively subtracts the frequency offset of the reference clock signal 19 from the frequency offset of the reference clock signal 33 to determine the reference frequency offset signal 56, which is +1 ppm, as shown by block 102. The divider 58 then divides the value of the reference frequency offset signal 56 by two to determine the average frequency offset signal 60, which is +0.5 ppm, as shown by block 104. The summer 62 then subtracts the value of the average frequency offset signal 60 from the value of the frequency error signal 53 to determine the frequency error signal 27, which is −1.5 ppm, as shown by block 106. The frequency error signal 27 is then transmitted to the circuitry 26 (FIG. 2) for processing, as shown by block 108.

Similarly, the frequency monitoring element 66 receives the clock signal 36 and the reference clock signal 33 and effectively subtracts the frequency offset of the reference clock signal 33 from the frequency offset of the clock signal 36 to determine the frequency error signal 67, which is −2 ppm. The frequency monitoring element 69 receives the reference clock signals 19 and 33 and subtracts the frequency offset of the reference clock signal 33 from the frequency offset of the reference clock signal 19 to determine the reference frequency offset signal 70, which is −1 ppm. The divider 72 then divides the value of the reference frequency offset signal 70 by two to determine the average frequency offset signal 74, which is −0.5 ppm. The summer 76 then subtracts the value of the average frequency offset signal 74 from the frequency error signal 67 to determine the frequency error signal 41, which is −1.5 ppm. Accordingly, the frequency error signal 41 is equal to the frequency error signal 27 even though the reference clock signal 33 is different from the reference clock signal 19. Thus, the clock signals 22 and 36 differ from the average oscillator frequency by −1.5 ppm.

Now assume that a communication problem arises on the subscriber line 14 (FIG. 1) and communication with the circuit card 11 is disrupted. Communication with the network communication device 10 may be switched from the subscriber line 14 to the subscriber line 15 such that the circuit card 12 becomes the primary card for communication. The frequency monitoring element 66 receives the clock signal 36, which is the clock signal for the data stream switched from the subscriber line 14 to the subscriber line 15, and the reference clock signal 33 and provides the frequency offset 67, which is still −2 ppm. Furthermore, the frequency monitoring element 69 continues to receive the reference clock signal 19 from the circuit card 11 despite the fact that the circuit card 11 is no longer the primary card. The frequency monitoring element 69 compares the reference clock signal 19 and the reference clock signal 33 and provides the reference frequency offset signal 70, which is still −1 ppm. The divider 72 divides the reference frequency offset signal 70 by two to provide the average frequency offset signal 74, which is −0.5 ppm. The summer 76 then subtracts the average frequency offset signal 74 from the frequency error signal 67 to determine the frequency error signal 41, which is −1.5 ppm. Thus, the frequency error signal 41 is identical to the frequency error signal 27 even after communication is switched to the backup circuit card 12. Accordingly, the switch is transparent to the output of the network communication device 10 such that there are no timing or measurement problems resulting from the switch, and a customer receives accurate frequency measurements before and after the switch.

The invention claimed is:

1. A frequency monitoring system, comprising:
    a frequency compare element configured to receive a clock signal;
    a first oscillator for generating a first reference clock signal independent of the clock signal; and
    a second oscillator for generating a second reference clock signal independent of the clock signal,
    wherein the frequency compare element is configured to receive the first and second reference clock signals, and wherein the frequency compare element is further configured to measure a frequency error of the clock signal relative to an average frequency of the first and second reference clock signals and to transmit a first frequency error signal indicative of the frequency error.

2. The system of claim 1, wherein the frequency compare element further comprises a first frequency monitoring element configured to compare the clock signal to the first reference clock signal, the first frequency monitoring element further configured to provide a second frequency error signal indicative of a frequency error of the clock signal relative to a frequency of the first reference clock signal, wherein the first frequency error signal is based on the second frequency error signal.

3. The system of claim 1, wherein the oscillator is temperature compensated.

4. The system of claim 1, further comprising a receiver coupled to a subscriber line, the receiver configured to receive a data signal from the subscriber line and to recover the clock signal from the data signal.

5. The system of claim 4, further comprising:
a first circuit board on which the first oscillator and the receiver reside; and
a second circuit board on which the second oscillator resides.

6. A frequency monitoring system, comprising:
a first oscillator for providing a first reference clock signal;
a second oscillator for providing a second reference clock signal; and
a frequency compare element configured to receive a clock signal and the first and second reference clock signals, the frequency compare element further configured to measure a frequency error of the clock signal relative to an average frequency of the first and second reference clock signals and to transmit a first-frequency error signal indicative of the frequency error, wherein the frequency compare element further comprises a first frequency monitoring element configured to compare the clock signal to the first reference clock signal, the first frequency monitoring element further configured to provide a second frequency error signal indicative of a frequency error of the clock signal relative to a frequency of the first reference clock signal, wherein the first frequency error signal is based on the second frequency error signals and wherein the frequency compare element further comprises a second frequency monitoring element configured to compare the first reference clock signal to the second reference clock signal, the second frequency monitoring element further configured to provide a reference frequency offset signal based on a comparison of the first reference dock signal to the second reference clock signal.

7. The system of claim 6, wherein the frequency compare element further comprises a divider configured to receive the reference frequency offset signal and divide a value of the reference frequency offset signal by a number thereby providing an average frequency offset signal indicative of an average difference between a frequency of the first reference clock signal and a frequency of the second reference clock signal.

8. The system of claim 7, wherein the frequency compare element further comprises a summer configured to combine the second frequency error signal and the average frequency offset signal, thereby providing the frequency error signal.

9. A method for monitoring frequencies, comprising the steps of:
receiving a clock signal;
generating a first reference clock signal independent of the clock signal;
generating a second reference clock signal independent of the clock signal; and
providing a first frequency error signal based on the clock signal and the first and second reference clock signals, the first frequency error signal indicative of a frequency error of the clock signal relative to an average frequency of the first and second reference clock signals.

10. The method of claim 9, further comprising the steps of comparing the clock signal to the first reference clock signal and providing a second frequency error signal indicative of a frequency error of the clock signal relative to a frequency of the first reference clock signal, wherein the first frequency error signal is based on the second frequency error signal.

11. The method of claim 9, further comprising:
receiving a data signal from a subscriber line; and
recovering the clock signal from the data signal.

12. A method for monitoring frequencies, comprising the steps of:
receiving a first reference clock signal;
receiving a second reference clock signal;
receiving a clock signal;
providing a first frequency error signal based on the clock signal and the first and second reference clock signals, the first frequency error signal indicative of a frequency error of the clock signal relative to an average frequency of the first and second reference clock signals;
comparing the clock signal to the first reference clock signal;
providing a second frequency error signal indicative of a frequency error of the clock signal relative to a frequency of the first reference clock signal, wherein the first frequency error signal is based on the second frequency error signal; and
comparing the first and second reference clock signals and providing a reference frequency offset signal based on a comparison of the first and second reference clock signals.

13. The method of claim 12, further comprising the step of dividing the reference frequency offset signal by a number thereby providing an average frequency offset signal.

14. The method of claim 13, wherein the providing the first frequency error signal step comprises the step of combining the second frequency error signal and the average frequency offset signal.

15. The method of claim 13, wherein the providing the first frequency error signal step comprises the step of subtracting the second frequency error signal and the average frequency offset signal.

* * * * *

UNITED STATES PATENT AND TRADEMARK OFFICE
CERTIFICATE OF CORRECTION

| | | |
|---|---|---|
| PATENT NO. | : 8,330,497 B1 | Page 1 of 1 |
| APPLICATION NO. | : 12/897444 | |
| DATED | : December 11, 2012 | |
| INVENTOR(S) | : James S. Butcher | |

It is certified that error appears in the above-identified patent and that said Letters Patent is hereby corrected as shown below:

In the Claims

Column 9, line 21, claim 6, replace "first-frequency" with --first frequency--.

Column 9, line 31, claim 6, replace "signals" with --signal--.

Signed and Sealed this
Seventh Day of July, 2015

Michelle K. Lee
*Director of the United States Patent and Trademark Office*